United States Patent [19]

Nomoto et al.

[11] Patent Number: 4,859,617
[45] Date of Patent: Aug. 22, 1989

[54] THIN-FILM TRANSISTOR FABRICATION PROCESS

[75] Inventors: Tsutomu Nomoto; Mamoru Yosida; Mikio Mouri; Tsukasa Watanabe, all of Tokyo, Japan

[73] Assignee: Oki Electric Industry Co., Ltd., Tokyo, Japan

[21] Appl. No.: 201,967

[22] Filed: Jun. 3, 1988

[30] Foreign Application Priority Data

Jun. 9, 1987 [JP] Japan ................................ 62-142268

[51] Int. Cl.$^4$ ........................................... H01L 21/265
[52] U.S. Cl. ..................................... 437/40; 437/937; 437/235; 437/238; 437/241; 437/941; 437/41; 357/23.7
[58] Field of Search ................. 437/937, 941, 41, 235, 437/241, 238, 40; 357/23.7

[56] References Cited

U.S. PATENT DOCUMENTS

| 4,113,514 | 12/1978 | Pankove et al. | 437/937 |
| 4,151,058 | 4/1979 | Kaplan et al. | 437/937 |
| 4,605,447 | 8/1986 | Brotherton et al. | 437/937 |

FOREIGN PATENT DOCUMENTS

| 0129265 | 5/1984 | European Pat. Off. | |
| 0155526 | 12/1981 | Japan | 437/937 |
| 0156760 | 12/1981 | Japan | 437/937 |
| 0012524 | 1/1982 | Japan | 437/937 |
| 0137218 | 8/1983 | Japan | 437/937 |
| 0027575 | 2/1984 | Japan | 437/937 |
| 0016462 | 1/1985 | Japan | 437/937 |
| 0051264 | 3/1987 | Japan | 437/937 |
| 2140202 | 11/1984 | United Kingdom | 437/937 |

OTHER PUBLICATIONS

Extended Abstracts, vol. 82-2, Oct. 1982, pp. 311-312, H. J. Stein et al.
Extended Abstracts, vol. 80-1, May 1980, pp. 464-466, No. 176, Y. Yatsuda et al.
Extended Abstracts, vol. 80-2, Oct. 1980, pp. 901-903, No. 352, H. J. Stein et al.
Proceedings of the S.I.D., vol. 26, No. 3, 1985, pp. 191-196, M. J. Powell.
Patent Abstracts of Japan, vol. 10, No. 325 (E-451) [2381], Nov. 6, 1986; & JP-A-61 133 662 (Canon Inc.) 20-06-1986.

Primary Examiner—Brian E. Hearn
Assistant Examiner—M. Wilczewski
Attorney, Agent, or Firm—Wenderoth, Lind & Ponack

[57] ABSTRACT

In a thin-film transistor fabrication process using an amorphous silicon semiconductor layer, after the gate insulation layer is formed and before the a-Si semiconductor layer is formed, the surface of the gate insulation layer is treated with an $H_2$ plasma. This treatment improves the transistor characteristics.

10 Claims, 2 Drawing Sheets or to be made smaller, giving liquid-crystal displays using such transistors a higher display resolution.

THIN-FILM TRANSISTOR FABRICATION PROCESS

BACKGROUND OF THE INVENTION

This invention relates to a fabrication process for making thin-film transistors.

Thin-film transistors using amorphous silicon (a-Si) are characterized by a high switching ratio and can be fabricated by a low-temperature process employing a glass substrate. They are used in devices such as active-matrix liquid-crystal displays. FIGS. 2A, 2B, and 2C are sectional views showing the steps in their fabrication.

The initial steps are illustrated in FIG. 2A. A first metal layer of a material such as nichrome (NiCr), chromium (Cr), or tungsten (W) on the order of 100 Å to 5000 Å in thickness is formed by vacuum evaporation or sputtering on a dielectric substrate 11 such as a glass substrate, and is patterned to form a gate electrode 12. Next a glow discharge step using $NH_3$ and $SiH_4$ as the principal gases is carried out to cover the entire substrate 11, including the gate electrode 12, with a silicon nitride film ($SiN_x$) having a thickness on the order of 0.1um to 1.0um, which serves as a gate insulation layer 13. Then a glow discharge step using $SiH_4$ as the principal gas is carried out to form an a-Si semiconductor layer 14 having a thickness on the order of 0.01 $\mu$m to 1.0 $\mu$m on top of the gate insulation layer. The glow discharge steps that create the gate insulation layer 13 and the a-Si semiconductor layer 14 are performed continuously in the same fabrication apparatus without breaking the vacuum.

Next the a-Si semiconductor layer 14 and the silicon oxide film 13 are patterned by a photolithography and dry etching step, specifically by a plasma etching step using $CF_4 + O_2$ gas, leaving the element region as shown in FIG. 2B. After this, a second metal layer 15 consisting of aluminum (Al) having a thickness on the order of 0.2 $\mu$m to 2.0 $\mu$m is formed by vacuum evaporation on top of the a-Si semiconductor layer 14.

This second metal layer 15 is then patterned as shown in FIG. 2C to form a drain electrode 15a and a source electrode 15b on the a-Si semiconductor layer 14, thus completing the a-Si thin-film transistor. A passivation layer, not shown in the drawings, may be formed over the completed device for surface protection.

Forming the silicon nitride gate insulation layer 13 and the a-Si semiconductor layer 14 continuously in the same apparatus inherently requires an apparatus which can be used for both process steps. Such an apparatus is not always available. Moreover, even when such an apparatus is available, the quality of the interface between the gate insulation layer 13 and the a-Si semiconductor layer 14 formed by the above process is not sufficient for some applications. Thin-film transistors fabricated as described above have a limited switching ratio ($I_{on}/I_{off}$ ratio) and electron mobility ($\mu$), and an undesirably large threshold voltage ($V_T$). The transistors must therefore be relatively large in size. Liquid-crystal displays using such transistors have been unable to achieve a high display resolution.

SUMMARY OF THE INVENTION

The present invention provides a thin-film transistor fabrication process in which, after the gate insulation layer is formed and before the a-Si semiconductor layer is formed, the surface of the gate insulation layer is treated with an $H_2$ plasma. The $H_2$ plasma treatment has been found to improve the switching ratio, electron mobility, and threshold voltage characteristics of the thin-film transistor.

DETAILED DESCRIPTION OF THE PREFERRED EMBODIMENTS

A preferred embodiment of this invention is described below with reference to the drawings.

Figure 1:
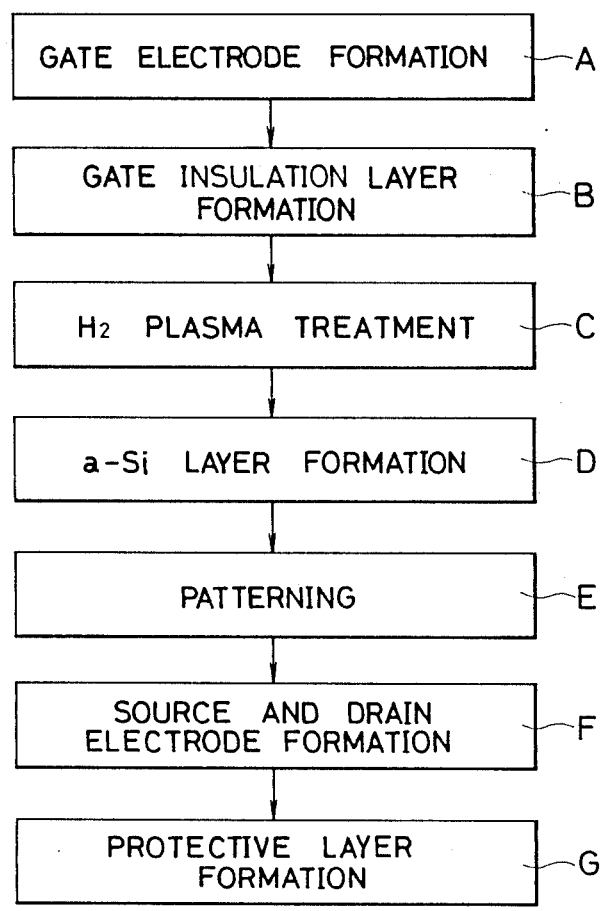
FIG. 1 is a process flowchart illustrating an embodiment of the thin-film transistor fabrication process of the present invention.
Figure 2A:
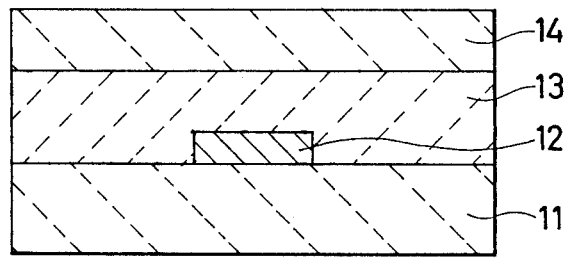
FIG. 2A to FIG. 2C are sectional views illustrating various steps in the thin-film transistor fabrication process of this invention, and also of the prior art.
Figure 2B:
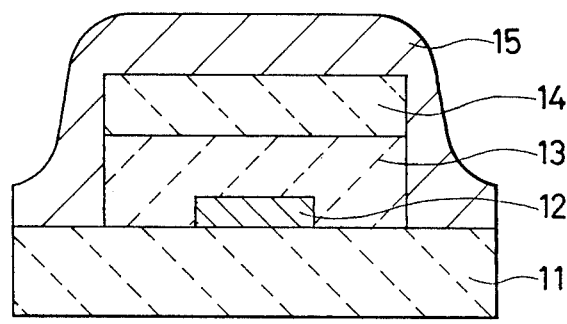
Figure 2C:
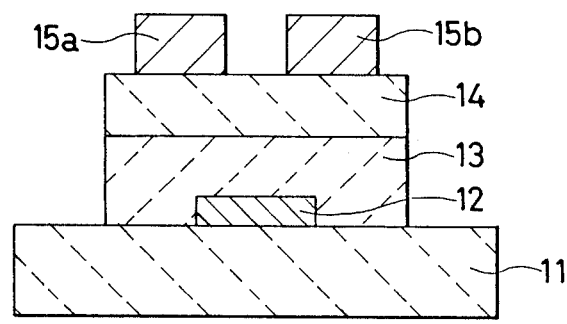

FIG. 1 is a process flowchart illustrating an embodiment of this invention. The sectional views of the element at each step in the process are the same as in the prior art as illustrated in FIG. 2, so a separate drawing is omitted.

The process in FIG. 1 begins with a first step A for forming a gate electrode 12 on a dielectric substrate 11 such as a glass substrate. This step is the same as in the prior art.

Next a second step B is performed to create a gate insulation layer 13 over the gate electrode 12 and the dielectric substrate 11. This step is also the same as in the prior art.

Following the second step B, a third step C is carried out in the same fabrication apparatus without breaking the vacuum, to expose the surface of the gate insulation layer to an $H_2$ plasma. The $H_2$ plasma is created by a glow discharge using 100% $H_2$ gas. The substrate temperature is set at 200° C. to 300° C., the gas flow at 10SSCM to 1000SSCM, the gas pressure at 50 pa to 400 pa, and the RF power density at 0.005 to 0.5 w/cm². The discharge time (process time) is set at 1 minute to 60 minutes.

Following the third step C, a fourth step D is carried out, still in the same fabrication apparatus without breaking the vacuum, to form an a-Si semiconductor layer 14 over the gate insulation layer 13. This step is the same as in the prior art.

The remaining steps are a fifth step E for patterning the gate insulation layer 13 and a-Si semiconductor layer 14 to remove the part outside the transistor element area, a sixth step F for forming source and drain electrodes 15a and 15b, and a seventh step G for covering the thin-film transistor element thus formed with a protective passivation layer (not shown in the drawings). These steps are all the same as in the prior art.

Thin-film transistors were actually fabricated by the inventor to determine the relationships between the $H_2$ plasma treatment in the process above and the transistor operating characteristics, specifically the $V_G$-$I_D$ characteristic, the electron mobility ($\mu$), and the threshold voltage ($V_T$). Table 1 at the end of the specification shows the results. The transistor size, expressed as channel width (W)/channel length (L), was 100/10 $\mu$m.

The data in Table 1 indicate that the $H_2$ plasma treatment step markedly improves the interface between the gate insulation layer 13 and the a-Si semiconductor layer 14, resulting in a greatly increased on-current $I_{on}$ (hence a greatly increased switching ratio $I_{on}/I_{off}$), a greatly reduced threshold voltage $V_T$, and a much higher electron mobility $\mu$. This invention thus enables small-size thin-film transistors to be manufactured. High-resolution liquid-crystal display devices can easily be made from such transistors.

Although the best results are obtained when the second step B (formation of the gate insulating film), the third step C ($H_2$ plasma treatment) and the fourth step D (formation of the a-Si film) are performed in the same apparatus without breaking the vacuum, the scope of the invention is not limited to this mode. When the second and the fourth steps must be performed in different apparatus (because for instance an apparatus that can be used for both steps is not available), results can still be obtained comparable to those when the second and fourth steps are performed in the same apparatus, but the third step is omitted. This is demonstrated by the experimental data in Table 2 at the end of the specification. In the experiments, the third step was performed in the same apparatus as the fourth step, but the second step was performed in a different apparatus. The $H_2$ gas flow rate was 100 SCCM and gas pressure was 100 pa.

As seen from Table 2, the best result (among the four cases in Table 2) was obtained when the plasma treatment was performed with a power of 0.14 w/cm$^2$ and for 5 min. The 0.007 w/cm$^2$-30 min. combination gave the second best result. This result is the nearest to the result in the right column in Table 1 (when the same apparatus was used for the two steps but the $H_2$ plasma treatment was not performed). The 0.14 w/cm$^2$-30 min. combination gave an inferior but satisfactory resut. This indicates that excessive $H_2$ plasma treatment gives a poor result, i.e., there is an upper limit in terms of power and time. When the power was 0.007 w/cm$^2$ and the time was 5 min. no difference from the case where no $H_2$ plasma treatment was performed was observed.

TABLE 1

|  | $H_2$ Plasma Treatment | |
|---|---|---|
|  | Performed | Not performed |
| $I_{on}$ (μA) ($V_G = 20$, $V_D = 10$) | 6 to 9 | 1 to 3 |
| $V_T$ (V) | 1 to 3 | 6 to 9 |
| μ (cm$^2$/V · S) | 0.4 to 0.5 | 0.1 to 0.3 |

TABLE 2

|  | $H_2$ Plasma Treatment | | | | |
|---|---|---|---|---|---|
|  | Performed | | | | Not Performed |
| w/cm$^2$ | 0.14 | 0.14 | 0.007 | 0.007 | — |
| min. | 5 | 30 | 5 | 30 | — |
| $I_{on}$ $V_G = 20$ V $V_D = 10$ V | 1 to 3 | 0.3 to 0.5 | 0.1 to 0.3 | 0.8 to 2.0 | 0.1 to 0.3 |
| $V_T$ (V) | 2 to 4 | 10 to 12 | 15 to 18 | 5 to 7 | 15 to 18 |
| u (cm$^2$/V S) | 0.1 to 0.25 | 0.03 to 0.05 | 0.03 to 0.05 | 0.1 to 0.2 | 0.03 to 0.05 |

| | $H_2$ Plasma Treatment | | | | |
|---|---|---|---|---|---|
|  | Performed | | | | Not Performed |
| Evaluation | Very Good | Intermediate | Poor | Good | Poor |

What is claimed is:

1. A thin-film transistor fabrication process comprising:
   a first step for forming a gate electrode on a dielectric substrate;
   a second step for forming a gate insulation layer over said gate electrode and said substrate;
   a third step for treating the surface of said gate insulation layer with a 2 plasma consisting of $H_2$ gas created by glow discharge with an RF power density of from 0.005 w/cm$^2$ to 0.5 w/cm$^2$ and for the duration of from 1 minute to 60 minutes;
   a fourth step for forming an amorphous silicon semiconductor layer over said gate insulating layer;
   a fifth step for patterning said gate insulation layer and said amorphous silicon semiconductor layer to remove the parts outside the transistor element area; and
   a sixth step for forming source and drain electrodes.

2. A thin-film transistor fabrication process according to claim 1, wherein
   the third step and the fourth step are performed in the same vacuum apparatus without breaking the vacuum between the third and the fourth steps.

3. A thin-film transistor fabrication process according to claim 2, wherein the substrate temperature during said third step is from 200° C. to 300° C.

4. A thin-film transistor fabrication process according to claim 2, wherein the gas flow during said glow discharge is from 10 SSCM to 1000 SSCM.

5. A thin-film transistor fabrication process according to claim 2, wherein the gas pressure employed in said glow discharge is from 50 pa to 400 pa.

6. A thin-film transistor fabrication process according to claim 2, wherein
   the second step is also performed in the same vacuum apparatus as the third and fourth steps without breaking the vacuum between the second and the third steps.

7. A thin-film transistor fabrication process according to claim 6, wherein the substrate temperature during said third step is from 200° C. to 300° C.

8. A thin-film transistor fabrication process according to claim 6, wherein the gas flow during said glow discharge is from 10 SSCM to 1000 SSCM.

9. A thin-film transistor fabrication process according to claim 6, wherein the gas pressure employed in said glow discharge is from 50 pa to 400 pa.

10. A thin-film transistor fabrication process according to claim 1, further comprising a seventh step for covering, with a protective layer, the entire device that has been formed by the first to the sixth steps.

* * * * *